(12) United States Patent
Xie

(10) Patent No.: US 7,262,079 B2
(45) Date of Patent: Aug. 28, 2007

(54) CONSOLIDATED FLIP CHIP BGA ASSEMBLY PROCESS AND APPARATUS

(75) Inventor: Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 94 days.

(21) Appl. No.: 11/056,821

(22) Filed: Feb. 10, 2005

(65) Prior Publication Data

US 2006/0175710 A1    Aug. 10, 2006

(51) Int. Cl.
*H01L 21/00* (2006.01)
(52) U.S. Cl. .................. 438/108; 438/106; 438/126; 438/125; 257/E21.001
(58) Field of Classification Search ............... 438/106, 438/108, 122, 126
See application file for complete search history.

(56) References Cited

U.S. PATENT DOCUMENTS

| | | | |
|---|---|---|---|
| 5,518,964 A | | 5/1996 | DiStefano et al. |
| 5,688,716 A | * | 11/1997 | DiStefano et al. ............ 438/55 |
| 6,219,911 B1 | * | 4/2001 | Estes et al. .................... 29/840 |
| 6,701,614 B2 | * | 3/2004 | Ding et al. .................... 29/848 |
| 2005/0026326 A1 | * | 2/2005 | Kiritani et al. ............. 438/108 |

FOREIGN PATENT DOCUMENTS

JP    410022342 A  *  1/1998

* cited by examiner

*Primary Examiner*—Michael Lebentritt
*Assistant Examiner*—Angel Roman
(74) *Attorney, Agent, or Firm*—Beyer Weaver LLP

(57) ABSTRACT

A flip chip packaging technique and associated apparatus that consolidates many or all of the steps in a conventional flip chip packaging process results in substantially decreased packaging time, e.g., only one to two hours, complexity, e.g., requiring fewer pieces and much simpler equipment, and cost, arising from reduced equipment operation and maintenance time and decreased labor. An assembly fixture useful for implementing the consolidated assembly technique engages and holds in place a semiconductor flip chip die with a plurality semiconductor package components in a desired package configuration so that they can be assembled into a semiconductor package with a single application of heat and pressure.

22 Claims, 9 Drawing Sheets

Single unit fixture 4 unit quad fixture 6 unit strip fixture

CONSOLIDATED FLIP CHIP BGA ASSEMBLY PROCESS AND APPARATUS

BACKGROUND OF THE INVENTION

This invention relates generally to semiconductor chip package assembly, and in particular to flip chip package assembly. More specifically, the invention relates to a consolidated flip chip BGA assembly process and apparatus in semiconductor device assembly.

Semiconductor flip chips can be bonded directly to a packaging substrate, without the need for separate wire bonds or tapes. Flip chip dies normally have solder bumps affixed to their bonding pads. During a packaging process, the die is "flipped" so the solder bumps form electrical interconnections between the die and metal pads on a packaging substrate. Semiconductor dies (chips) of this type are commonly called "flip chips." Flip chip technology has several advantages over earlier wire bond technology for many applications. Flip chip technology offers the highest speed electrical performance of any semiconductor package technology, since eliminating bond wires reduces the inductance and capacitance of the die to package substrate interconnection and greatly shortens the interconnection path. The replacement of perimeter wires with direct solder bonds on the active face of the chip also results in a more durable package with greater input/output connection flexibility.

Despite all the advantages of flip chip technology, the microelectronic assembly process used to package a flip chip die for connection to an electronic device remains a time consuming multi-stage process.

Referring to FIG. 1, stages in a conventional method 100 for packaging a semiconductor flip chip are illustrated. First, a flip chip die and a packaging substrate are electrically interconnected and mechanically bonded in a solder joining operation. The die 10 is aligned with and placed onto a packaging substrate 104 such that the die's solder bumps 106 are aligned with metal pads or pre-solder on the substrate 104 (101). The substrate 104 can be made of an organic metal oxide or ceramic material, for example. Heat is applied causing the solder bumps to reflow and form electrical connections between the die and the packaging substrate (110). The package is then cooled to harden the solder jointed interconnection.

An underfill 122 is then applied in order to enhance the mechanical bonding of the die and substrate (120). An underfill material, typically a thermo-set epoxy, is dispensed to fill the remaining space (or "gap") between the die and the substrate. The underfill is then cured by a heating process (130).

In order to improve the thermal performance and reliability of flip chip packages, stiffeners and/or heat spreaders are often used. A stiffener 142 may be placed around the die on the substrate where it is bonded with a heat curable organic adhesive. The stiffener (also sometimes referred to as a "picture frame") is typically a flat piece of high modulus metal about 10 to 40 mils thick, having substantially the same dimensions as the package substrate with a window in its center to clear the die. Typically, the stiffener is composed of nickel-plated copper which has a coefficient of thermal expansion similar to that of typical substrate materials. The stiffener is typically bonded in a separate step following curing of the underfill material (140). The purpose of the stiffener is to constrain the substrate in order to prevent its warpage or other movement relative to the die which may be caused by thermal cycling during operation of an electronic device in which the package is installed. Such movement may result from the different coefficients of thermal expansion (CTE) of the die and substrate materials, and may produce stress in the die or the package as a whole which can result in electrical and mechanical failures.

A heat spreader 162 (a heat sink also sometimes referred to as a "lid"), typically composed of a high thermal conductivity material, and having substantially the same dimensions as the package substrate is typically also attached over the stiffener 142 and the die 102 and bonded to the substrate by a thermally conductive organic adhesive 152. The heat spreader may have a hard or a soft connection with the die via a thermal compound, typically a thermal adhesive or grease, respectively, applied to the top of the die 102 (on its inactive surface) and the stiffener 142 (150). The same or different thermal compound/adhesive can be used for bonding to the die and the stiffener. A conventional heat spreader is also typically a flat piece of the same type of material that is used for the stiffener, for example, nickel-plated copper about 20 to 40 mils thick. A heat spreader may also have a form that allows for direct attachment to the substrate, such as through edges or legs that descend from the flat piece overlying the die to contact the substrate. The heat spreader 162 is usually applied in a separate step following attachment of the die 102 and stiffener 142, if any (160). The purpose of the heat spreader is to disperse the heat generated during operation.

To complete the flip chip package 172, solder balls 174 are attached to the opposite side of the packaging substrate 104 from the die 102 to form a ball grid array (BGA) used to attach the flip chip package to a printed circuit board (PCB) for incorporation into an electronic device, in a subsequent process.

This packaging technique requires several pieces of equipment, multiple process steps and take several days to complete the assembly process. The complexity and time required result in substantial cost. Thus, it would be desirable to simplify and shorten the flip chip packaging process.

SUMMARY OF THE INVENTION

To achieve the foregoing, the present invention provides a flip chip packaging technique and associated apparatus that consolidates many or all of the steps in a conventional flip chip packaging process. The consolidated assembly operation results in substantially decreased packaging time, e.g., only one to two hours, complexity, e.g., requiring fewer pieces and simpler equipment, and cost, arising from reduced equipment operation and maintenance time and decreased labor.

An assembly fixture useful for implementing the consolidated assembly technique engages and holds in place a semiconductor flip chip die with a plurality semiconductor package components in a desired package configuration so that they can be assembled into a semiconductor package with a single application of heat and pressure.

These and other features and advantages of the present invention are described below.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention provides a flip chip packaging technique and associated apparatus that consolidates many or all of the steps in a conventional flip chip packaging process. The consolidated assembly operation results in substantially decreased packaging time, e.g., only one to two hours, complexity, e.g., requiring fewer pieces and much simpler equipment, and cost, arising from reduced equipment operation and maintenance time and decreased labor. An assembly fixture useful for implementing the consolidated assembly technique engages and holds in place a semiconductor flip chip die with a plurality semiconductor package components in a desired package configuration so that they can be assembled into a semiconductor package with a single application of heat and pressure.

General Aspects of Consolidated Process and Assembly Fixture

Figure 1:
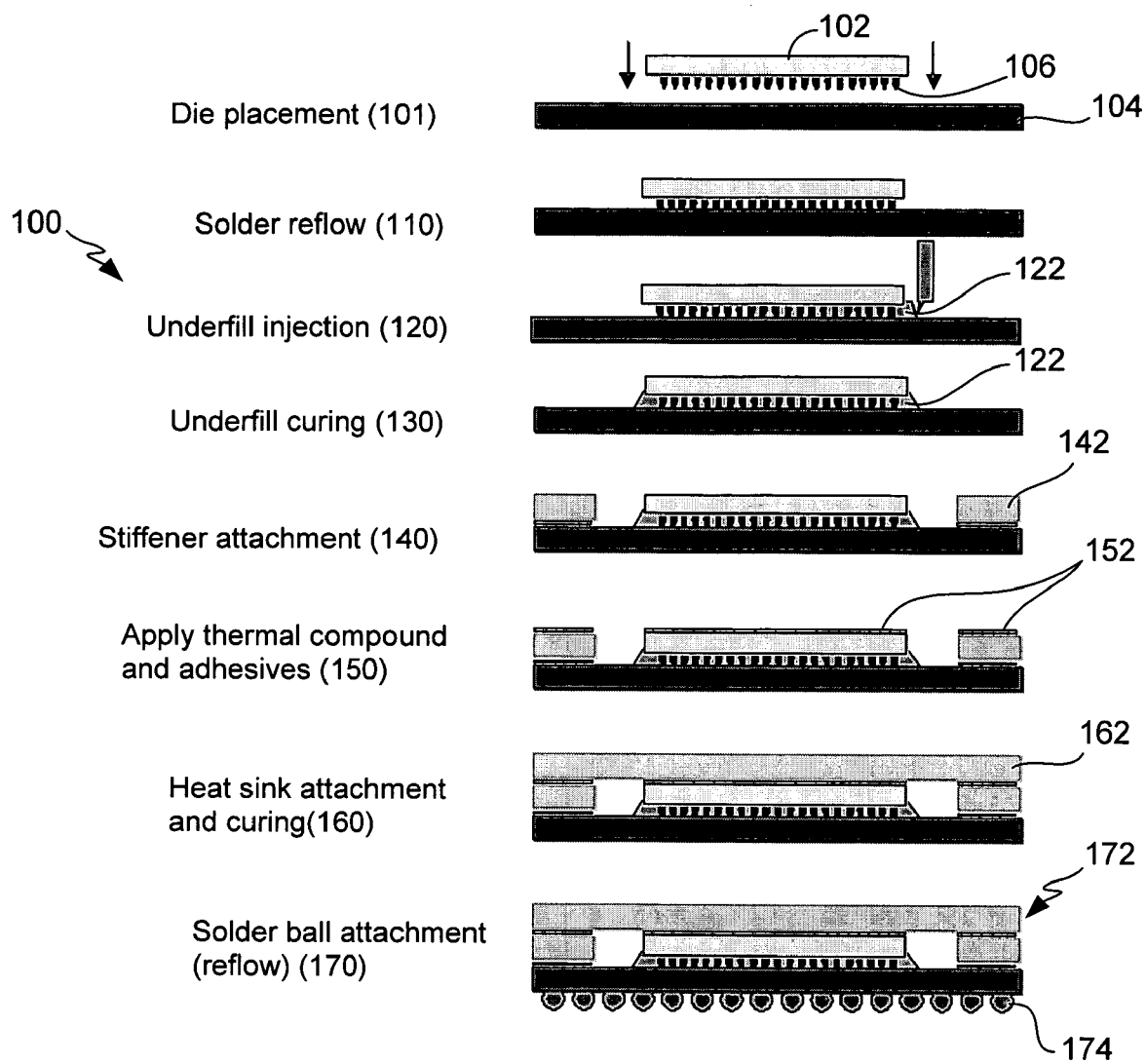
FIG. 1 illustrates a conventional flip chip packaging process.
Figure 2A:
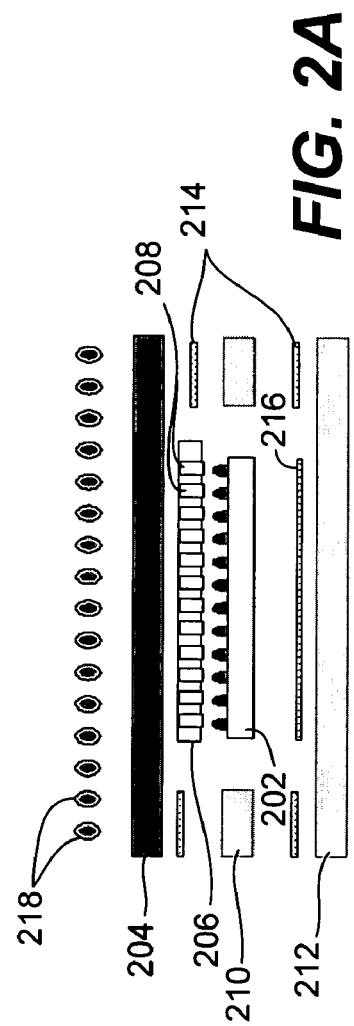
FIGS. 2A-C illustrate a consolidated flip chip packaging technique and assembly fixture in accordance with the present invention.
Figure 2B:
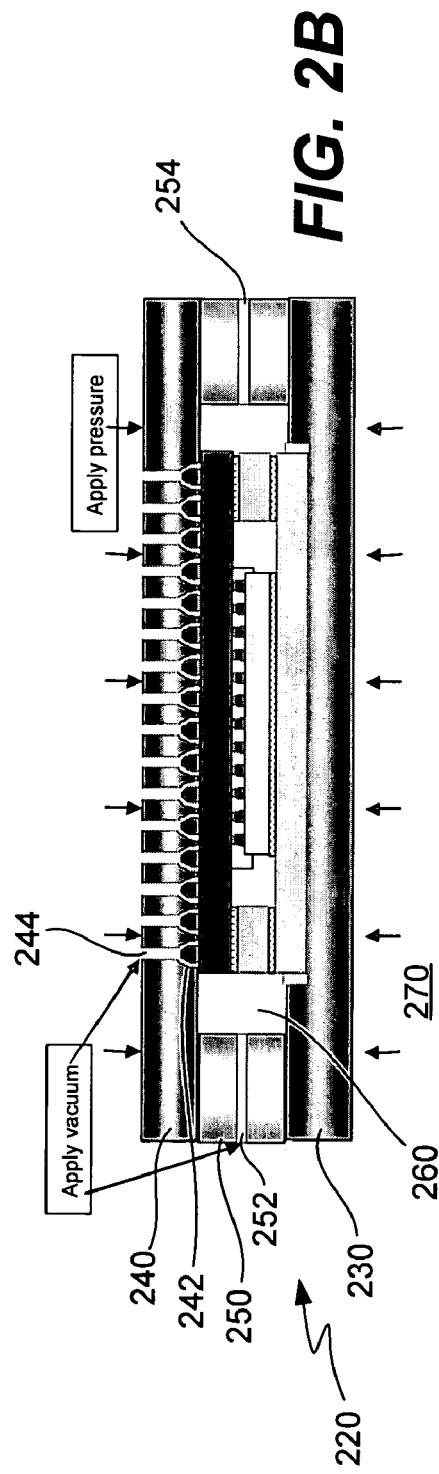
Figure 2C:
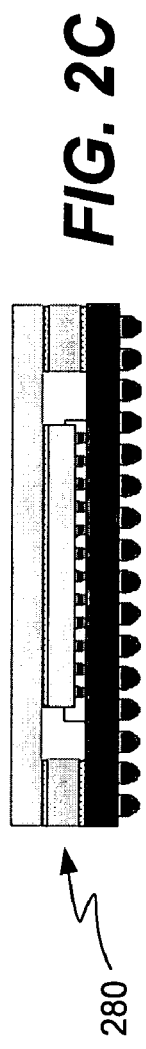

The consolidated flip chip packaging technique is illustrated in FIGS. 2A-C with reference to a specific assembly fixture in accordance with the present invention. As will be described more fully below, there are many possible variations in package components, assembly fixture and associated packaging techniques consistent with the practice of the present invention. However, FIGS. 2A-C facilitate a general explanation of the invention.

Referring to FIG. 2A, various elements of a flip chip package for assembly in accordance with the present invention are illustrated, including a flip chip die 202 (including solder bumps), a packaging substrate 204, a self-supporting underfill material 206 with holes 208 for the flip chip 202 solder bumps, a stiffener 210, a heat spreader 212, adhesives 214 and thermal compound 216 for attachment of the stiffener and heat spreader, and ball grid array (BGA) solder balls 218. The package components may vary slightly in other embodiments of the invention, as discussed further below.

Conventional flip chip package components are well known in the art and the invention is applicable to the assembly of flip chip packages using such materials or comparable and/or improved materials subsequently developed. As noted above, package assembly in accordance with the present invention proceeds with a self-supporting underfill material, rather than a conventional liquid underfill material that is typically applied by an injection process. The self-supporting underfill material will retain its form so that it stays in place where positioned, rather than flow to areas where it is not needed or wanted, when it is aligned with the other package materials in the assembly fixture prior to and during the application of heat and pressure to assemble the package. In preferred embodiments, the self-supporting underfill material is a solid phase material, such as an B staged epoxy or prepreg film. Such films are configured to accommodate the flip chip solder bumps by pre-drilling, cutting or punching, etc. with holes which match the solder bump pattern of the chip. Examples of suitable solid underfill materials are predrilled epoxy films such as are available from Ablestik, Rancho Dominguez, Calif. or prepreg films, such as are available from Mitsubishi, JP (e.g., BT prepreg). Such materials can be handled without dispensing or injection apparatus and thus also simplify the assembly process.

Rather than assembling these components according to the standard multi-step technique described above, the present invention provides a method and apparatus for assembly of the package in as few as a single operation by consolidating some or all of the steps from the standard packaging process.

Referring to FIG. 2B, the package components are arranged together in an assembly fixture 220 configured to accommodate the components and keep them correctly aligned with one another during the assembly process. The components are arranged relative to one another as they will be in the completed package. If necessary, the solder balls for the BGA may be initially had in place by solder flux prior to securing of the package components in the closed fixture. The assembly fixture 220 is configured to engage and hold in place the package components and die during assembly and to withstand the environmental conditions to which it will be subjected during package assembly. These conditions can include, for example, peak temperatures above the solder reflow temperature (e.g., up to 200° C. or higher), prolonged exposure to elevated temperatures (e.g., about 150° C. for about 1 hour) and pressures (compressive stress) of up to 100s PSI, depending on type of adhesives and assembly material used. The pressure can be applied as result of the closing of the assembly fixture or be applied through an additional hot press.

The assembly fixture 220 is composed of a material stable under the required conditions. Preferably, the assembly fixture 220 is made of a metal or alloy, for example steel, nickel, aluminum, copper, or their alloys (e.g., bronze, brass, etc.), high temperature stable polymers such as polytetrafluoroethylene (Teflon®), or other high temperature materials including ceramics, glass and high temperature plastics, or combinations of these materials.

The fixture 220 includes a base 230 configured to engage a first major package surface, in this case the heat spreader 212, and a cover 240 configured to engage a second major package surface, in this case the packaging substrate 204. In this case the cover 240 is also configured to accommodate BGA balls 218 with ball shells 242. The fixture 220 also includes openings providing fluid communication between the package enclosure defined, at least in part, by the base and cover, and the exterior of the assembly fixture. The term "fluid" in this instance refers to a gas a liquid phase. The openings provide access to apply a vacuum or provide any needed fluids (gases or liquids) to the package enclosure and to vent the package enclosure to allow dissipation of any volatile wastes generated during the assembly process. The openings can be provided in the base 230 and/or cover 240 pieces, or another piece of the fixture 220. This particular assembly fixture also includes a spacer 250 positioned between the base 230 and the cover 240 at the periphery of the assembly fixture 220 to complete the enclosure. Openings 252, 254 in the spacer 250 are also provided for fluid communication between the interior 260 of the fixture 220, defined by the base 230, cover 240 and spacer 260, which provides a package enclosure, and the exterior 270 of the assembly fixture 220. In other embodiments, the spacer 250 may be replaced by extensions on the base and or cover components of the assembly which can perform the function of creating a package enclosure when the base and cover are engaged.

The package components are arranged in the fixture 220 prior to engagement of the fixture components to close the fixture and enclose the package components. Once the package components are arranged, the assembly fixture is closed by securing together the base 230 and the cover 240 and any other pieces, for example one or more spacers 250. The assembly pieces can be secured by a variety fasteners including screws, latches, clips, clamps, etc. In some embodiments, the base 230 and cover 240 may be hinged to one another.

In this particular embodiment, the base 230 of the assembly fixture 220 has a cavity 232 sized to accommodate the heat spreader component 212 of a flip chip package. In other embodiments, such as are described in more detail below, the cover may also have a cavity sized to accommodate the package substrate component 204 of a flip chip package to be assembled. The appropriate cavity size can be determined depending upon the dimensions of the package components to be assembled. It should be sized to allow easy insertion of the components prior to assembly and removal of the completed package following assembly, while maintaining the required degree of alignment between the package components during the package assembly process.

Normally, the cavity dimensions should slightly larger than the substrate and heat spreader's dimensions to ensure that during heating and handling, the package components will not become stuck in the cavity. The difference in dimensions will vary depending upon the materials used. The cavity should not be so much larger than the package component dimensions that it loses its alignment capability. In many instances, a difference of 0.5 mm will be suitable. For example, in one embodiment, for a heat spreader of dimensions 35 mm×35 mm, a cavity size of 35.5 mm×35.5 mm is suitable.

A number of different base and/or cover pieces of the assembly fixture may be provided to suit various package dimensions. Alternatively, or in addition, a set or sets of spacers designed to fit different package sizes may be provided to fit into a single or reduced set of base and/or cover pieces so that the amount of base tooling can be reduced.

As noted above, in the embodiment depicted in FIG. 2B, the cover 240 is configured to engage BGA balls 218 with ball shells 242. The ball shells 242 are arranged with the appropriate pitch for the desired BGA and designed to accommodate the solder balls in proper alignment before and after reflow without adhering to or alloying with the solder balls 218. To accomplish this, the ball shells are preferably coated with a non-stick finish, such as Teflon or anodized aluminum. Each ball shell 242 has its own vent path 244 to release solvent and chemical vapors during the heating cycle (when the solder balls are reflowed).

Figure 3:
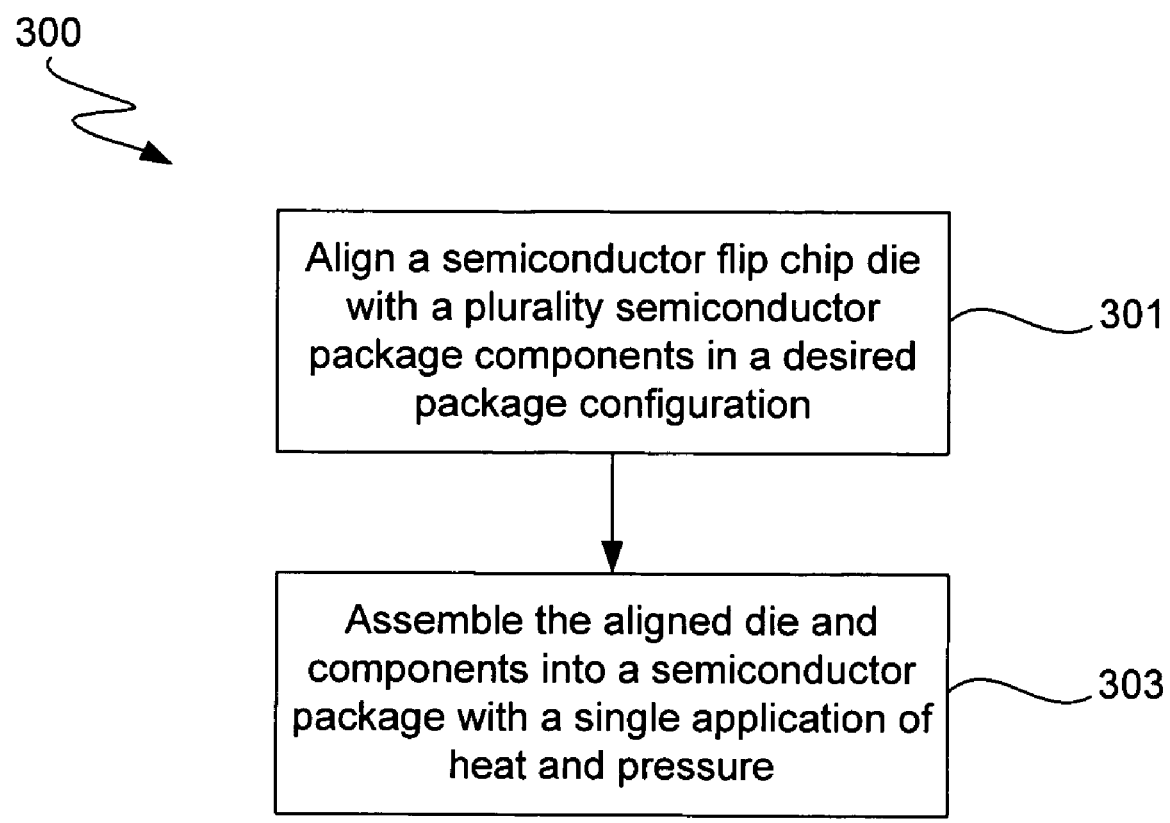
FIG. 3 is a process flow diagram showing a consolidated flip chip packaging technique in accordance with the present invention.

Once the package components are arranged and aligned in the assembly fixture 220, the components can be joined to form the package in a single process operation in which the package components are subjected to heat and pressure. FIG. 3 is a process flow diagram showing a consolidated flip chip packaging technique in accordance with the present invention. The consolidated assembly method 300 begins with the alignment of a semiconductor flip chip die with a plurality semiconductor package components in a desired package configuration (301). The die and package components may be aligned within an assembly fixture configured to engage and hold in place the package components and die during assembly. A suitable assembly fixture has a base configured to engage a first major package surface, e.g., the heat spreader, and a cover configured to engage a second major package surface, e.g., the packaging substrate. It should be understood that the terms "base" and "cover" used in this application are relative terms and may be used interchangeably. The fixture also has openings providing fluid communication between a package enclosure defined by the base and cover and the exterior of the assembly fixture. The openings allow passage of fluids that may be liquid (e.g., molding compound injection) or gaseous (e.g., an exhaust vent for air and/or volatiles generated by solder reflow and/or underfill curing during the heating operation or during vacuum application). The aligned die and components are then assembled into a semiconductor package with a single application of heat and pressure (303).

The packaging process operation involves a heat cycle that includes a solder reflow stage in which the temperature is raised to a sufficient level for a few minutes to reflow the solder bumps and balls to form the electrical connections between the die and the packaging substrate and from the BGA. A temperature of about 200° C. (e.g., 210° C.) for about 1-3 minutes (e.g., 1 minute), for example, may be used for this stage. The heat cycle further includes a curing stage in which the temperature is maintained at an elevated level for sufficient time to permit curing of polymeric (e.g., epoxy) materials used in the package. This is primarily for the underfill material, but may also be relevant for the adhesives used to bond the stiffener and heat spreader or mold compound, depending on the particular package structure and materials used. A suitable curing stage may be at a temperature of about 150° C. for about 1 hour, for example.

Figure 4:
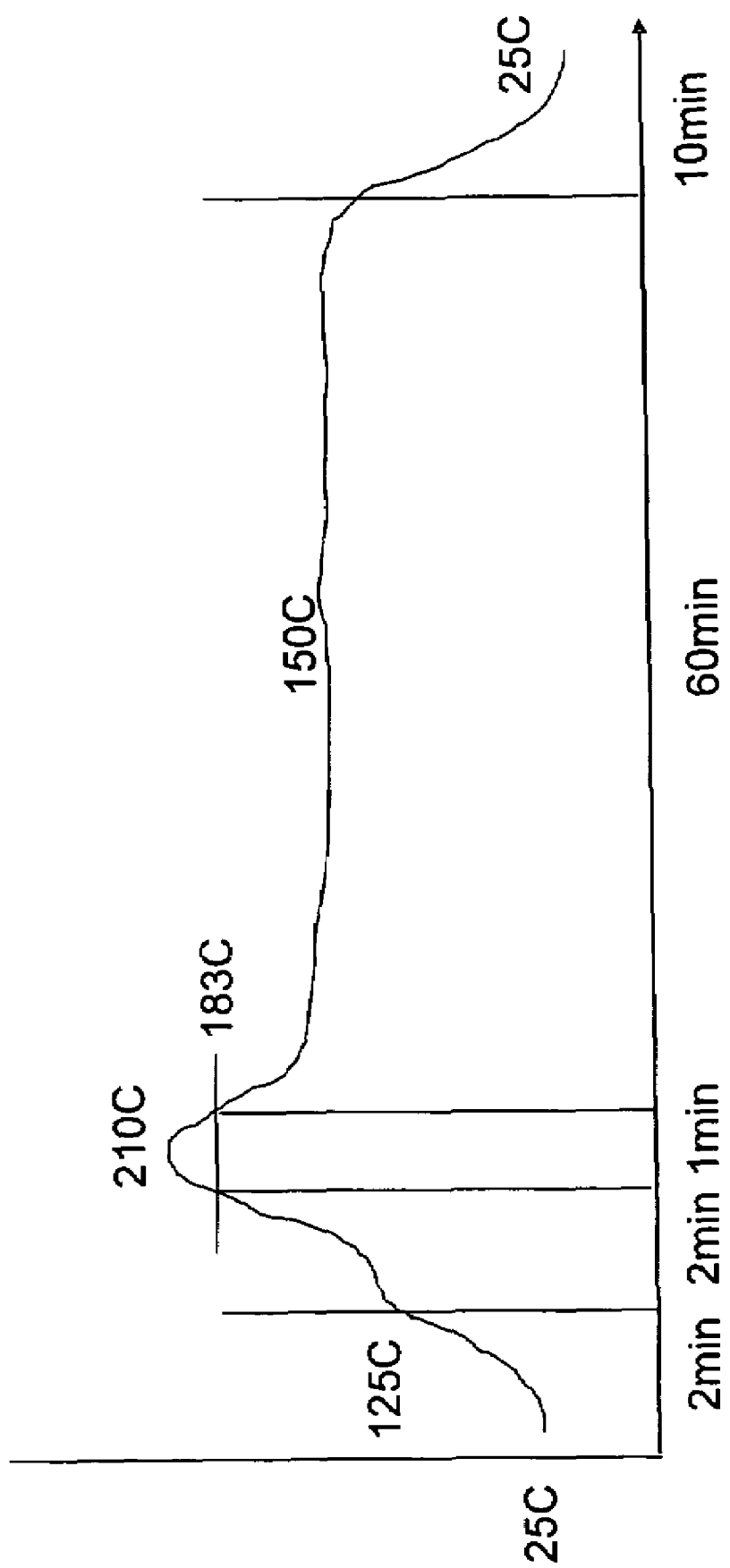
FIG. 4 is a representative plot of temperature vs. time illustrating the temperature profile of a consolidated assembly process in accordance with one embodiment of the present invention.

FIG. 4 is a representative plot of temperature vs. time illustrating the temperature profile of a consolidated assembly process in accordance with one embodiment of the present invention. The package components in the assembly fixture are initially at room temperature. The fixture is heated to beyond the solder reflow temperature of 183° C. within a few (4) minutes and remains there for about a minute before dropping to the curing temperature of about 150° C. for about an hour. The temperature is then dropped back down near or to room temperature prior to releasing the completed package from the assembly fixture.

Figure 5:
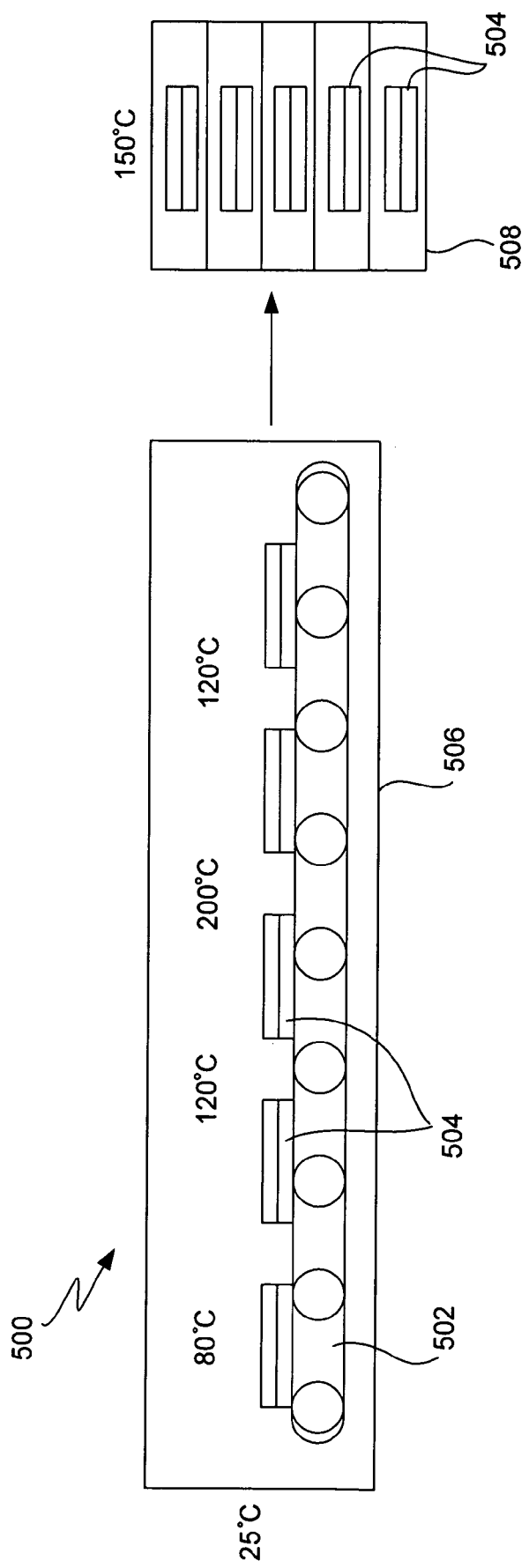
FIG. 5 is a simplified schematic diagram of a package assembly system in accordance with one embodiment of the present invention.

In order to accomplish this heating cycle, a flip chip package assembly system according to the present invention may be used. Referring to the simplified schematic diagram of FIG. 5, the system 500 includes a conveyer 502 to carry assembly fixtures 504 loaded with package components through an oven 506, generally a vacuum oven or an oven with an inert gas environment, such as $N_2$ or filled, having the relevant temperature zones to achieve the heating cycle described above. The system also includes a separate curing oven 508 maintained at the appropriate temperature. The curing oven can be a vacuum oven or a convection oven with an inert gas (e.g., nitrogen, argon) atmosphere. Following the solder reflow stage, the assembly fixture or fixtures 504 may be removed from the conveyor 502 and placed in a curing oven 508 until curing is finished. The fixture(s) may then be removed from the curing oven and cooled to room temperature, and the completed package(s) may be removed from the fixture(s).

During the heat cycle, the package components are pressed together by force applied through the assembly fixture. For example, a pressure of up to 100 PSI may be applied to the assembly fixture and conveyed to the package during the heat cycle. The pressure may be applied during the closure of the fixture or be externally applied in the curing oven or a separate heat press. The force pressing the package component together may be also be provided in whole or in part by the assembly fixture itself where the dimensions of the enclosure formed by the base and cover and any other assembly fixture pieces are such that closure and fastening of the pieces results in force applied to the packaging components, in particular compressive force applied on the major surfaces such as the packaging substrate and heat spreader.

In addition, a vacuum is preferably applied to the package components via one or more of the openings in the fixture. The vacuum facilitates joining of the components and removal of volatile waste products generated during the heat cycle. A vacuum environment is preferred, but an inert gas (e.g., $N_2$, argon, etc.) may also be used.

FIG. 2C illustrates the completed flip chip package 280 following removal from the assembly fixture.

As noted above, the present invention provides the benefit of a flip chip packaging technique and associated apparatus that consolidates many or all of the steps in a conventional flip chip packaging process. The consolidated assembly operation results in substantially decreased packaging time, e.g., only one to two hours, complexity, e.g., requiring fewer pieces and much simpler equipment, and cost, arising from reduced equipment operation and maintenance time and decreased labor.

Alternative Embodiments

Figure 6A:
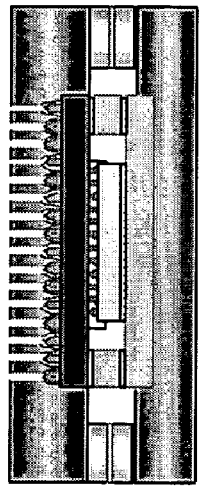
FIG. 6 illustrate various embodiments of an assembly fixture in accordance with the present invention.
Figure 6B:
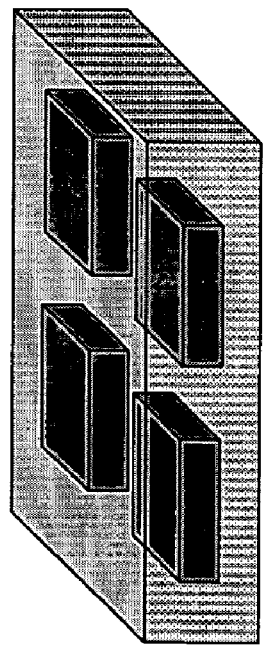
Figure 6C:
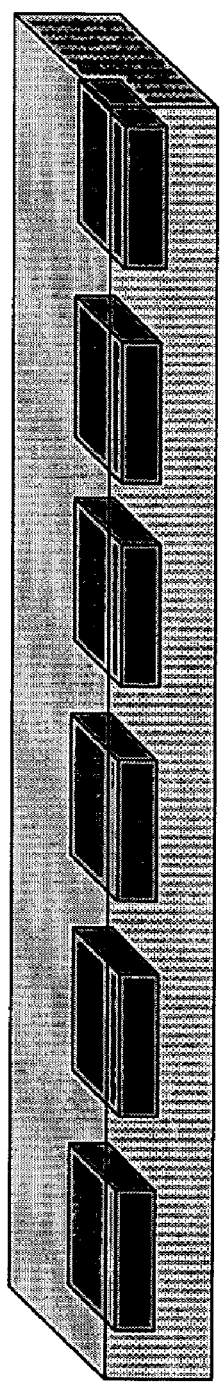

FIGS. 6A-C illustrate various embodiments of an assembly fixture in accordance with the present invention. The assembly fixture may accommodate a single flip chip package unit, as illustrated in FIG. 6A and previously described above. Alternative assembly fixtures may accommodate a plurality of flip chip package units in boat/magazine configurations such as are illustrated in FIGS. 6B and 6C in simplified form. For Example, the fixture depicted in FIG. 6B has a four unit quad format, and the fixture depicted in FIG. 6C has a six unit strip format. The other aspects of an assembly fixture in accordance with the present invention and its use in a packaging technique and/or system, described above, apply equally to these alternative assembly fixture designs.

Figure 7A:
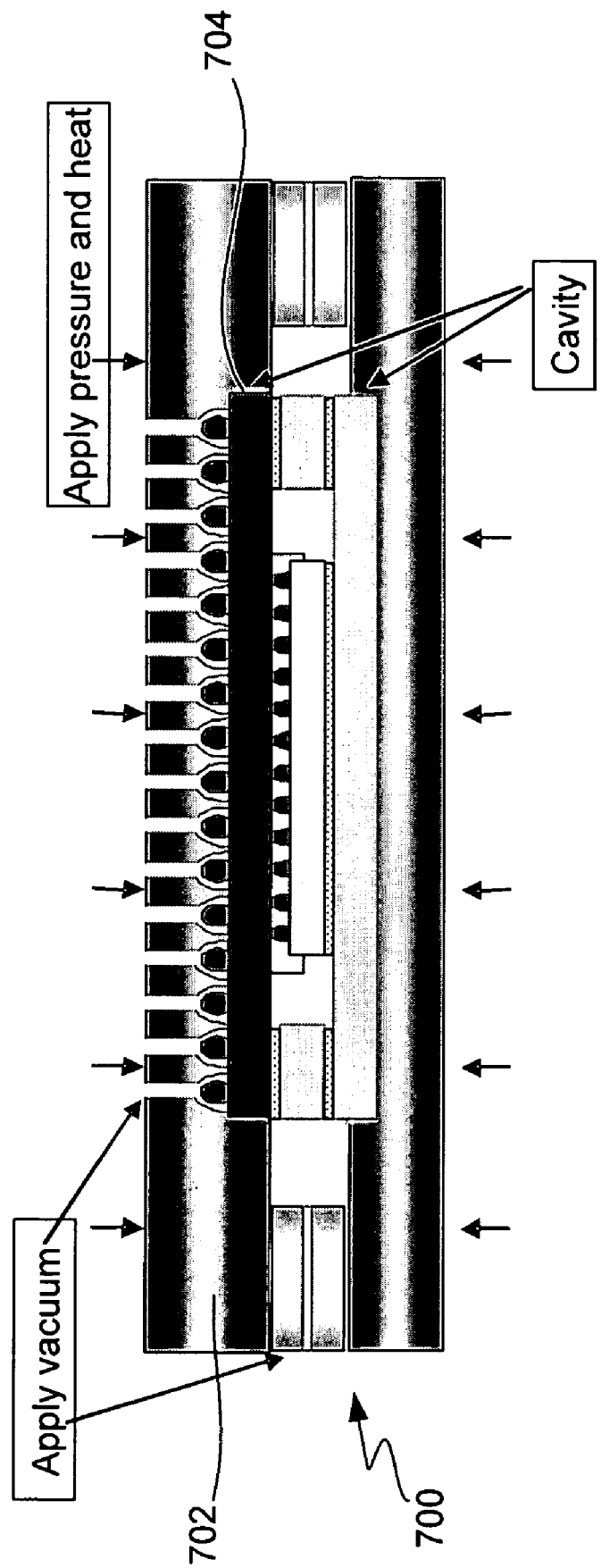
FIGS. 7A-B illustrate various embodiments of a consolidated flip chip packaging technique incorporating heat spreaders and stiffeners, and associated assembly fixtures in accordance with the present invention.
Figure 7B:
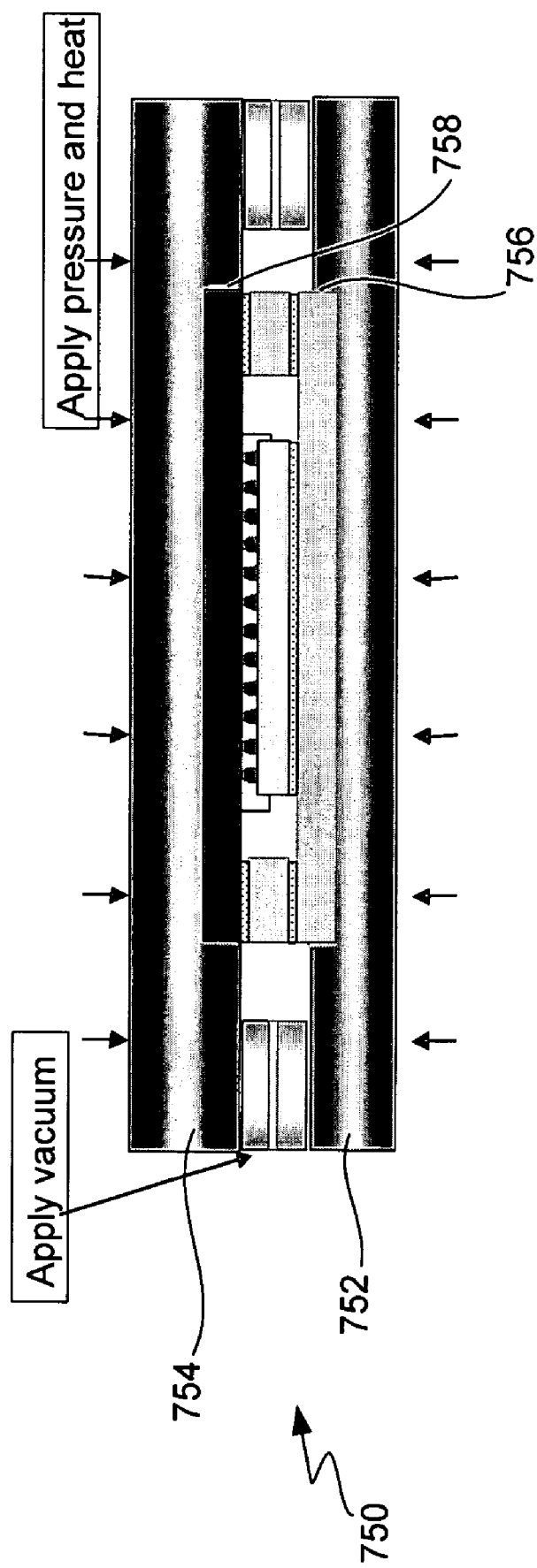

FIGS. 7A-B illustrate various embodiments of a consolidated flip chip packaging technique incorporating heat spreaders and stiffeners, and associated assembly fixtures in accordance with the present invention.

The fixture 700 of FIG. 7A has a cover 702 with a cavity 704. In other respects it is like the fixture depicted in FIG. 2B. This embodiment provides enhanced engagement with package components loaded in the fixture 700 which may be helpful in maintaining their alignment throughout the assembly process.

The fixture of FIG. 7B is like the fixture of FIG. 7A with both the base 752 and cover 754 of the fixture 750 having cavities, 756 and 758, respectively. However, in this embodiment, the package components do not include solder balls for formation of a BGA and the cover 754 does not include ball shells. This embodiment is useful for assembly of packages without ball grid arrays, such as land grid array (LGA) packages. Or this embodiment may be used where a BGA is desired to be added in a subsequent processing operation outside the assembly fixture 750.

Figure 8:
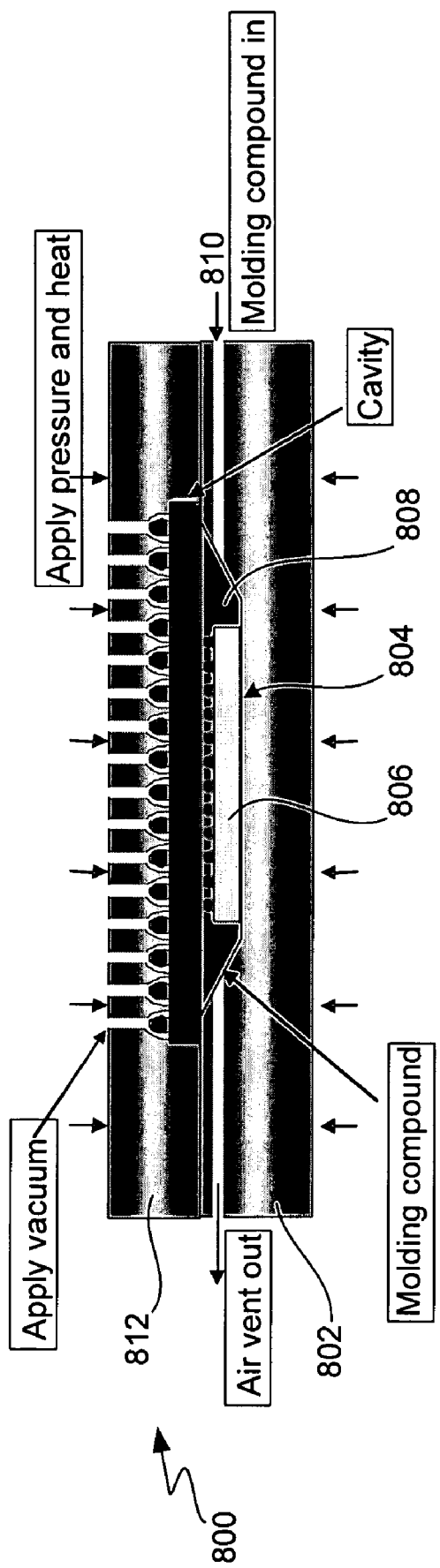
FIG. 8 illustrates an embodiment of a consolidated flip chip packaging technique incorporating a molding compound, and associated assembly fixtures in accordance with the present invention.

Another implementation of the invention is depicted in FIG. 8. FIG. 8 illustrates an embodiment of a consolidated flip chip packaging technique incorporating a molding compound, and associated assembly fixtures in accordance with the present invention. In this embodiment, the package components do not include a stiffener and heat spreader. The hear sink adhesive, stiffener, heat spreader and thermal compound are absent and the base 802 of the fixture 800 is configured as a mold cap. The mold cap base 802 engages the inactive side 804 of the flip chip die 806 and is formed to mold a molding compound to the proper shape. The molding compound 808 may be dispensed into mold cap base 802 when the package components are arranged in the fixture 800 prior to engagement of the fixture components to close the fixture and enclose the package components. In another preferred embodiment, the molding compound 808 may be provided to the interior of the assembly fixture 800 after it is closed via the openings 810 provided in the fixture for fluid communication between the interior and exterior of the fixture. In the embodiment depicted in FIG. 8, the base 802 and cover 812 are configured in such a way that separate spacers are not required and the openings 810 provided in the fixture 800 for fluid communication between the interior and exterior of the fixture are in the base piece 802. Following the assembly heat cycle, the fixture is opened to release a completed molded flip chip package.

It should be understood that such a molded package may also be fabricated without a BGA, as described with reference to FIG. 7B, using the appropriate assembly fixture. Likewise, aspects of the fixture depicted in this embodiment may also be present in alternative embodiments useful for assembly of heat spreader/stiffener containing packages, for example, the elimination of spacers.

As the alternative embodiments described and illustrated herein indicate, a myriad possible packaging schemes may be implemented in accordance with the principles of the present invention described and claimed herein. Given the disclosure provided herein with regard to the assembly fixtures and associated assembly process, one of skill in the semiconductor packaging art will readily understand how the invention may be adapted to other packaging types not explicitly described herein.

One further embodiment of interest that may be implemented in accordance with the present invention is assembly of a package in which the flip chip die is unbumped. In this case, the solder for the electrical connections between the die and the packaging substrate comes from solder paste that is printed into a predrilled epoxy film or prepreg underfill packaging component. The solder paste in the underfill holes reflows and forms the electrical connections during the heat cycle of the assembly process.

CONCLUSION

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed:

1. A method of assembling a semiconductor flip chip package, comprising:
    aligning a semiconductor flip chip die with a plurality of semiconductor package components in a desired package configuration, wherein the package components comprise:
        a base configured to engage a first surface of the flip chip die; and
        a cover configured to engage a second surface of the flip chip die; and
    assembling the die and components into a semiconductor package with a single application of heat and pressure.

2. The method of claim 1, wherein the die and package components are aligned within an assembly fixture configured to engage and hold in place the package components and die during assembly.

3. The method of claim 2, wherein the assembly fixture further comprises:
    a plurality of openings providing fluid communication between a package
    enclosure defined by the base and cover and the exterior of the assembly fixture.

4. The method of claim 3, wherein the openings for fluid communication are in one or more of the base and the cover.

5. The method of claim 3, wherein the assembly fixture further comprises one or more spacers positioned between the base and the cover at the periphery of the assembly fixture to complete the enclosure.

6. The method of claim 5, wherein the openings for fluid communication are in the one or more spacers.

7. The method of claim 2, wherein the assembly fixture is comprised of a material selected from the group consisting of metal, polytetrafluoroethylene, high temperature plastic, ceramic, glass and combinations thereof.

8. The method of claim 7, wherein the assembly fixture is a metal selected from the group consisting of steel, Ni, Al, copper, bronze, their alloys, and combinations thereof.

9. The method of claim 2, wherein the assembly fixture accommodates a single flip chip.

10. The method of claim 2, wherein the assembly fixture accommodates a plurality of flip chips.

11. The method of claim 1, wherein the base is configured to engage a heat spreader package component and the cover is configured to engage a packaging substrate.

12. The method of claim 1, wherein the base is configured to engage an inactive side of the flip chip die.

13. The method of claim 1, wherein the base comprises a cavity.

14. The method of claim 1, wherein the cover comprises a cavity.

15. The method of claim 1, wherein the cover comprises ball shells.

16. The method of claim 15, wherein the ball shells are vented.

17. The method of claim 1, wherein the package components comprise a packaging substrate and a self supporting underfill material.

18. The method of claim 17, wherein the underfill material comprises an epoxy or prepreg film.

19. The method of claim 1, wherein the package components further comprise a heat spreader, a stiffener, adhesives and thermal compound for attachment of the stiffener and heat spreader.

20. The method of claim 1, wherein the base and cover comprise a molding compound.

21. The method of claim 1, wherein the package components further comprise ball grid array (BGA) solder balls formed on the cover.

22. The method of claim 1, wherein the die is unbumped and solder paste is printed into a predrilled epoxy film or prepreg packaging component.

* * * * *